United States Patent
Chang et al.

(10) Patent No.: US 9,413,377 B1
(45) Date of Patent: Aug. 9, 2016

(54) SWITCHED CAPACITOR CIRCUIT AND COMPENSATION METHOD THEREOF, AND ANALOG TO DIGITAL CONVERTER

(71) Applicants: NCKU RESEARCH AND DEVELOPMENT FOUNDATION, Tainan (TW); HIMAX TECHNOLOGIES LIMITED, Tainan (TW)

(72) Inventors: Soon-Jyh Chang, Tainan (TW); Tz-Jing Shau, Tainan (TW); Chung-Ming Huang, Tainan (TW)

(73) Assignees: LNCKU RESEARCH AND DEVELOPMENT FOUNDATION, Tainan (TW); HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 14/968,924

(22) Filed: Dec. 15, 2015

(51) Int. Cl.
*H03M 1/06* (2006.01)
*H03M 1/44* (2006.01)
*H03H 19/00* (2006.01)

(52) U.S. Cl.
CPC ............ *H03M 1/442* (2013.01); *H03H 19/006* (2013.01); *H03M 1/06* (2013.01)

(58) Field of Classification Search
CPC ..... H03M 1/442; H03M 3/454; H03M 1/403; H03F 3/005; H03F 1/303
USPC ................... 341/118, 120, 155, 172
See application file for complete search history.

(56) References Cited

U.S. PATENT DOCUMENTS

| | | | | |
|---|---|---|---|---|
| 5,796,300 A * | 8/1998 | Morgan | ................... | H03F 1/303 330/51 |
| 6,608,504 B2 * | 8/2003 | Fujimoto | ............. | G11C 27/026 327/344 |
| 8,400,339 B2 * | 3/2013 | Garrity | ................... | H03F 3/005 341/139 |

OTHER PUBLICATIONS

Hyun H. Boo et al., "A 12b 250MS/s Pipelined ADC with Virtual GroundReference Buffers," 2015 IEEE International Solid-State Circuits Conference, Feb. 24, 2015.
Ahmed M. Abdelatty Ali et al., "Background calibration of operational amplifier gain error in pipelined AD converters," IEEE Transactions on Circuits and Systems—II: Analog and Digital Signal Processing, vol. 50, No. 8, Sep. 2003.

(Continued)

*Primary Examiner* — Peguy Jean Pierre
(74) *Attorney, Agent, or Firm* — CKC & Partners Co., Ltd.

(57) ABSTRACT

A switched capacitor circuit with feedback compensation is provided. First terminals of a feedback capacitor and at least one capacitor are coupled to a first input terminal of a differential amplifier. Second terminals of the feedback capacitor and the capacitor are coupled to an input terminal during a first period. A feedback compensation circuit amplifies a first voltage on the first input terminal of the differential amplifier by a gain greater than one to generate a second voltage. The second terminal of the feedback capacitor is coupled to the output terminal of the differential amplifier, and the feedback compensation circuit applies the second voltage to the second terminal of the capacitor during a second period.

11 Claims, 8 Drawing Sheets

(56) References Cited

OTHER PUBLICATIONS

Omar A. Hafiz et al., "Immediate Calibration of Operational Amplifier Gain Error in Pipelined ADCs Using Extended correlated Double Sampling," IEEE Journal of Solid-State Circuits, vol. 48, No. 3, Mar. 2013.

Yuichi Miyahara et al., "Adaptive Cancellation of Gain and Nonlinearity Errors in Pipelined ADCs," 2013 IEEE International Solid-State Circuits Conference, Feb. 19, 2013.

* cited by examiner

SWITCHED CAPACITOR CIRCUIT AND COMPENSATION METHOD THEREOF, AND ANALOG TO DIGITAL CONVERTER

BACKGROUND

1. Field of Invention

The present invention relates to a switched capacitor circuit. More particularly, the present invention relates to the switched capacitor circuit having feedback compensation, an analog-to-digital converter and a compensation method.

2. Description of Related Art

FIG. 1 is a diagram illustrating a conventional switched capacitor circuit. Referring to FIG. 1, a non-inverting input terminal of a differential amplifier 110 is coupled to the ground. An inverting input terminal of the differential amplifier 110 is coupled to first terminals of capacitors $C_F$ and $C_S$. The second terminal of the capacitor $C_F$ is coupled to an output terminal of the differential amplifier 110 or an input voltage $V_{in}$. The second terminal of the capacitor $C_S$ is coupled to the input voltage $V_{in}$ or a reference voltage $V_{REF}$. During a sampling period, switches SW12, SW13 and SW15 are closed, and switches SW11 and SW14 are open at the same time. Therefore, the input voltage $V_{in}$ is charging the capacitors $C_F$ and $C_S$. At the end of the sampling period, the switch SW15 is open. During an amplifying period, the switch SW14 is closed, the switch SW 13 are open, and the capacitor $C_S$ is connected to the reference voltage $V_{REF}$. Meanwhile, the switch SW12 is open and the switch SW11 is closed so that the capacitor $C_F$ is connected to the output terminal of the differential amplifier 110.

If the differential amplifier 110 is ideal, that is, the gain of the differential amplifier 110 is infinite and the difference voltage $V_X$ between input terminals of the differential amplifier 110 is equal to 0, then the relationship between an output voltage $V_{OUT}$, the input voltage $V_{in}$ and the reference voltage $V_{REF}$ can be written as following equations (1) and (2) based on the law of charge conservation.

$$V_{in}(C_S+C_F)=V_{REF} \times C_S + V_{OUT} \times C_F \qquad (1)$$

$$V_{OUT} = \frac{V_{in}(C_S + C_F) - V_{REF} \times C_S}{C_F} \qquad (2)$$

If the capacitance $C_F$ and $C_S$ are the same, then as shown in the equation (2), the switched capacitor circuit in FIG. 1 is used to multiply the input voltage $V_{in}$ by two and subtract the reference voltage $V_{REF}$ from the product. However, if the differential amplifier 110 is not ideal, then the gain (i.e. "A" hereinafter) is finite and the voltage $V_X$ is not equal to 0. In this case, the law of charge conservation can be written as a following equation (3), and the output voltage $V_{OUT}$ can be approximated as shown in a following equation (4).

$$\begin{cases} V_{in}(C_S + C_F) = (V_{REF} - V_X) \times C_S + (V_{OUT} - V_X) \times C_F \\ -V_X \times A = V_{OUT} \end{cases} \qquad (3)$$

$$V_{OUT} \approx \frac{V_{in}(C_S + C_F) - V_{REF} \times C_S}{C_F} \times (1 - 1/A\beta) \qquad (4)$$

$$\beta = \frac{C_F}{C_S + C_F} \qquad (5)$$

When $1/A\beta$ is small enough, the output voltage $V_{OUT}$ approximates to the ideal as disclosed in the equations (2) and (4). However, β is less than 1 as shown in the equation (5). Therefore, the gain A has to be large, and it becomes a design bottleneck and it is also an issue concerned by the people in the art.

SUMMARY

Embodiments of the present invention provide a switched capacitor circuit with feedback compensation, a compensation method and an analog-to-digital converter.

Embodiments of the invention provide a switched capacitor circuit including following units. A differential amplifier has a first input terminal, a second input terminal and an output terminal. A feedback capacitor has a first terminal coupled to the first input terminal of the differential amplifier. A capacitor bank includes at least one capacitor, wherein a first terminal of each of the at least one capacitor is coupled to the first input terminal of the differential amplifier. A feedback compensation circuit is coupled to the first input terminal of the differential amplifier and a second terminal of each of the at least one capacitor. During a first period, a second terminal of the feedback capacitor and the second terminal of each of the at least one capacitor are connected to an input terminal electrically through a switch circuit. In the first period, the feedback compensation circuit is idle. During a second period, the switch circuit electrically connects the second terminal of the feedback capacitor to the output terminal of the differential amplifier, and the feedback compensation circuit amplifies a first voltage on the first input terminal of the differential amplifier by a gain greater than one to generate a second voltage, and applies the second voltage to the second terminal of the at least one capacitor.

In an embodiment, the feedback compensation circuit includes an amplifier coupled to the first input terminal of the differential amplifier for amplifying the first voltage to generate the second voltage; and a buffer coupled between an output of the amplifier and the second terminal of the at least one capacitor.

In an embodiment, a number of the at least one capacitor is N, N is a positive integer, and the gain of the amplifier is (N+1)/N when the second voltage is applied to the second terminal of each of the at least one capacitor.

In an embodiment, a number of the at least one capacitor is greater than one, and the gain of the amplifier is 2 when the second voltage is applied to the second terminal of only one of the capacitors. In addition, the feedback compensation circuit directly applies the first voltage to the buffers without amplifying, and the second voltage is applied to the second terminals of other ones of the capacitors.

In an embodiment, the switch circuit includes following units. A first switch is coupled between the second terminal of the feedback capacitor and the output terminal of the differential amplifier. A second switch is coupled between the second terminal of the feedback capacitor and the input terminal. The third switch group is coupled between the input terminal and the second terminal of the at least one capacitor. The switch number of the third switch group is at least one. During the first period, the first switch is open, and the second switch and the at least one third switch are closed. During the second period, the first switch is closed, and the second switch and the third switch group are open. A fourth switch is coupled between the first terminal of the differential amplifier and a virtual ground terminal. The fourth switch is closed during a sub period of the first period, and is open during the second period. At least one fifth switch is coupled between the second terminal of the at least one capacitor and the buffer. The at least one fifth switch is open during the first period, and is closed during the second period.

In an embodiment, a sub analogy-to-digital converter is coupled to the input terminal, and generates a digital code according to an input voltage on the input terminal. A decoder is coupled to the sub analogy-to-digital converter and the feedback compensation circuit, and determines a reference voltage according to the digital code.

Embodiments of the invention provide a compensation method for the switched capacitor circuit. The compensation method includes: electrically connecting a second terminal of the feedback capacitor and a second terminal of each of the at least one capacitor to an input terminal during a first period; amplifying a first voltage on the first input terminal of the differential amplifier by a gain greater than one to generate a second voltage; and electrically connecting the second terminal of the feedback capacitor to the output terminal of the differential amplifier, and applying the second voltage to the second terminal of the at least one capacitor during a second period.

Embodiments of the invention provide a pipeline analogy-to-digital converter which is built of multiple stages. Each stage includes the following units. A differential amplifier has a first input terminal, a second input terminal and an output terminal. A feedback capacitor has a first terminal coupled to the first input terminal of the differential amplifier. A capacitor bank includes at least one capacitor, wherein a first terminal of each of the at least one capacitor is coupled to the first input terminal of the differential amplifier. In the design, a feedback compensation circuit is added to stages with high gain amplifier requirement. A feedback compensation circuit is coupled to the first input terminal of the differential amplifier and a second terminal of each of the at least one capacitor. During a first period, a second terminal of the feedback capacitor and the second terminal of each of the at least one capacitor are connected to an input terminal electrically through a switch circuit. The feedback compensation circuit amplifies a first voltage on the first input terminal of the differential amplifier by a gain greater than one to generate a second voltage. During a second period, the switch circuit electrically connects the second terminal of the feedback capacitor to the output terminal of the differential amplifier, and the feedback compensation circuit applies the second voltage to the second terminal of the at least one capacitor.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

The using of "first", "second", "third", etc. in the specification should be understood for identifying units or signals described by the same terminology, but are not referred to particular order or sequence. In addition, the "couple" used in the specification should be understood for electrically connecting two units directly or indirectly. In other words, when "a first object is coupled to a second object" is written in the specification, it means another object may be disposed between the first object and the second object.

Figure 1:
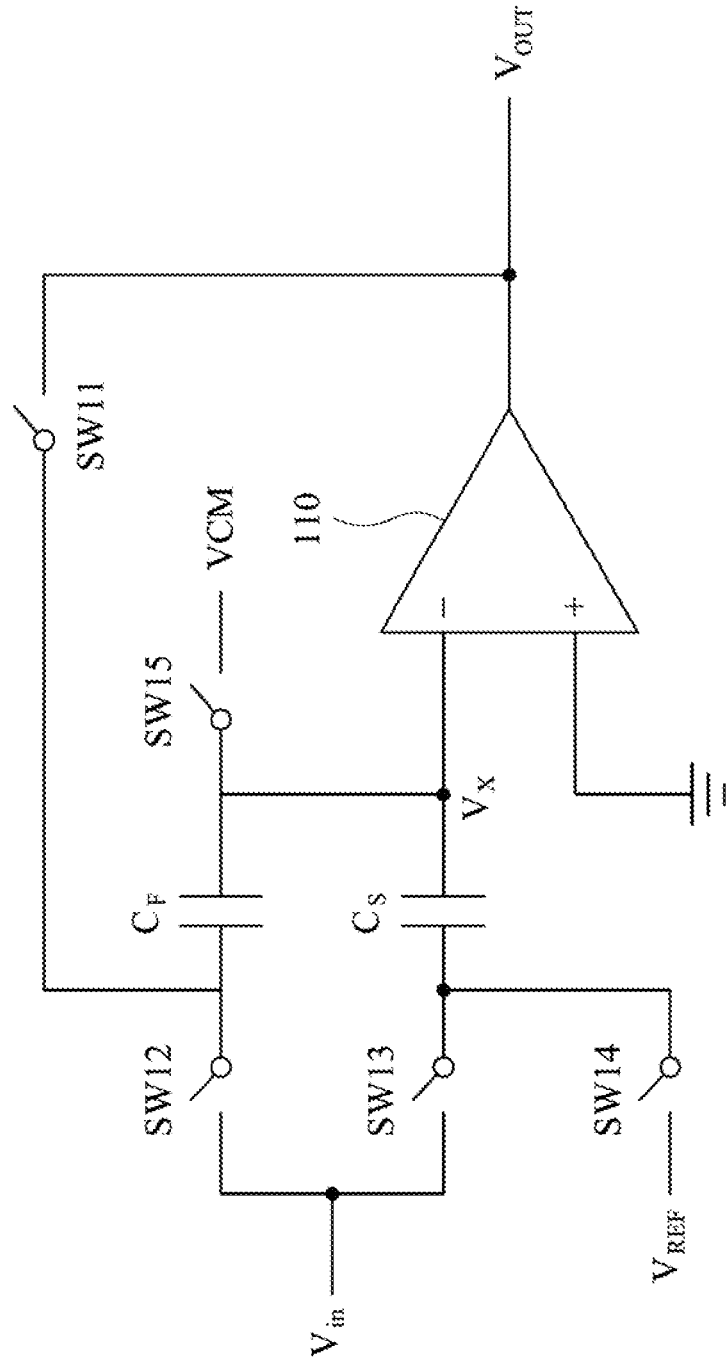
FIG. 1 is a diagram illustrating a conventional switched capacitor circuit.
Figure 2:
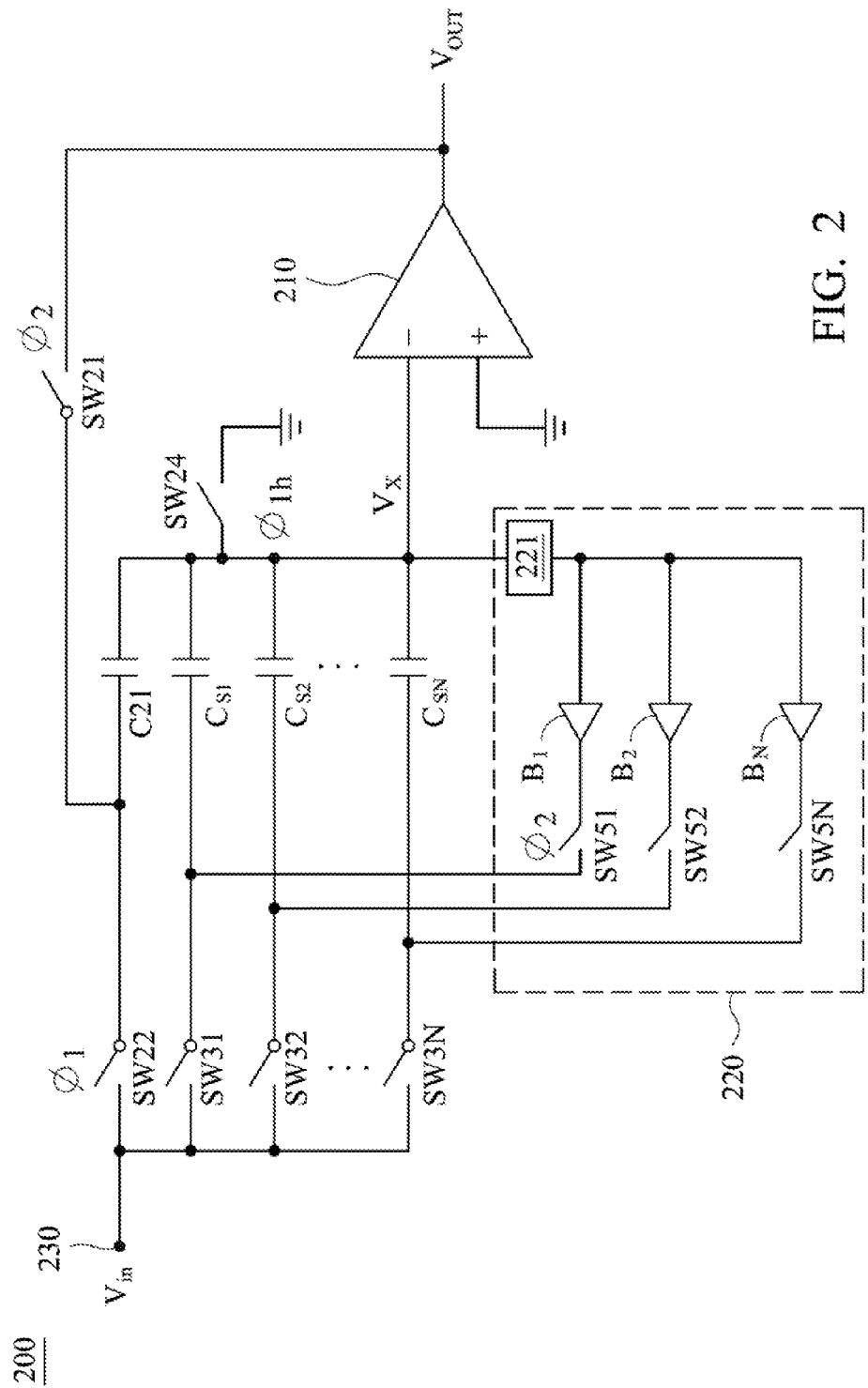
FIG. 2 is a diagram illustrating a switched capacitor circuit with feedback compensation according to an embodiment.

FIG. 2 is a diagram illustrating a switched capacitor circuit with feedback compensation according to an embodiment. Referring to FIG. 2, a switched capacitor circuit 200 includes a differential amplifier 210, a feedback capacitor C21, a capacitor bank including N capacitors $C_{S1}$-$C_{SN}$, a switch circuit and a feedback compensation circuit 220. N is a positive integer. In the embodiment, N is greater than one, but N may be one in another embodiment. The switch circuit includes switches SW21, SW22, SW31-SW3N, SW24, and SW51-SW5N, and the switch circuit is controlled by a control circuit (not shown).

A first input terminal (e.g. an inverting input terminal) of the differential amplifier 210 is coupled to first terminals of the feedback capacitor C21 and the capacitors $C_{S1}$-$C_{SN}$. A second input terminal (e.g. a non-inverting input terminal) of the differential amplifier 210 is coupled to a virtual ground terminal (also referred to a common-mode voltage). A second terminal of the feedback capacitor C21 is coupled to an input terminal 230 and an output terminal of the differential amplifier 210. Second terminals of the capacitors $C_{S1}$-$C_{SN}$ are coupled to the input terminal 230. The switch SW21 (also referred to a first switch) is coupled between the second terminal of the feedback capacitor C21 and the output terminal of the differential amplifier 210. The switch SW22 (also referred to a second switch) is coupled between the second terminal of the feedback capacitor C21 and the input terminal 230. The number of the switches SW31-SW3N (also referred to third switches) is also N, and the switches SW31-SW3N are coupled between the input terminal 230 and the second terminals of the capacitors $C_{S1}$-$C_{SN}$. The switch SW24 is coupled between the first input terminal of the differential amplifier 210 and the virtual ground terminal.

The feedback compensation circuit 220 is coupled to the first input terminal of the differential amplifier 210 and the second terminals of the capacitors $C_{S1}$-$C_{SN}$. In the embodiment, the feedback compensation circuit 220 includes an amplifiers 221 and N buffers $B_1$-$B_N$. The buffers $B_1$-$B_N$ are coupled between the output terminal of the amplifier 221 and the second terminals of the capacitors $C_{S1}$-$C_{SN}$. The amplifiers 221 are coupled between the first input terminal of the differential amplifier 210 and the buffers $B_1$-$B_N$. The switches SW51-SW5N (also referred to fifth switches) are respectively coupled between the second terminals of the capacitors $C_{S1}$-$C_{SN}$ and the buffers $B_1$-$B_N$.

Figure 3:
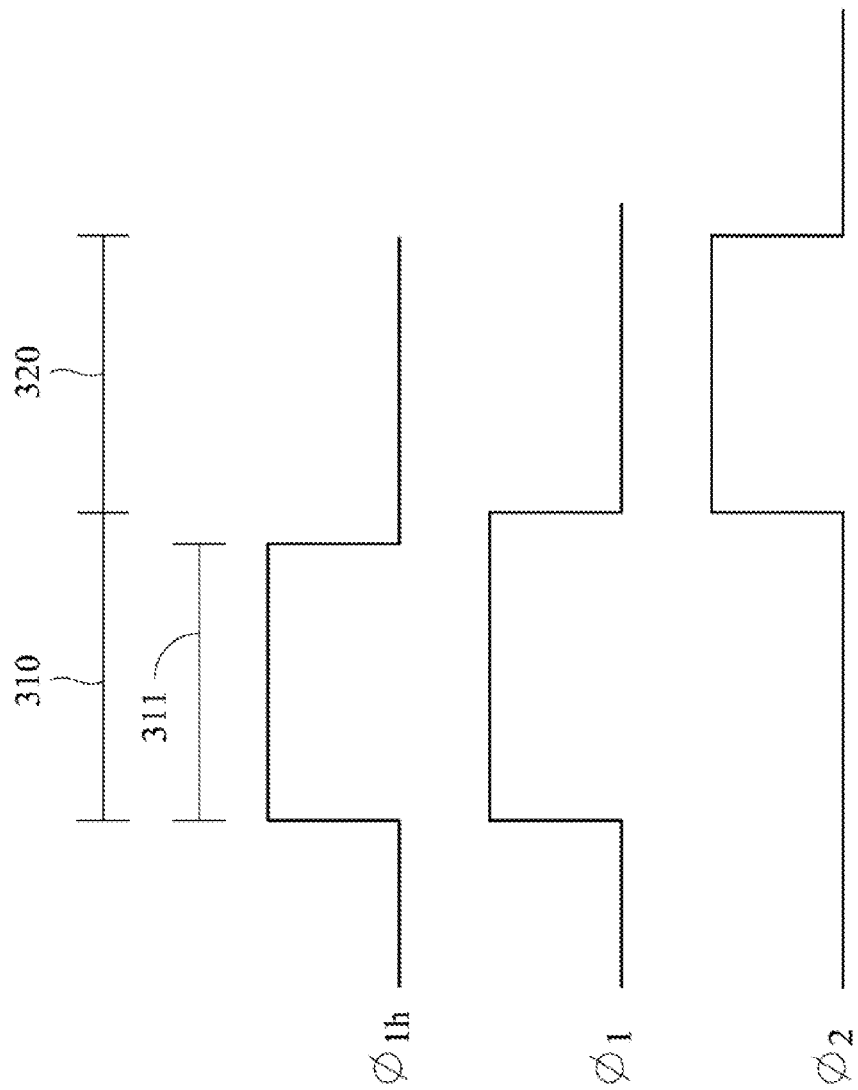
FIG. 3 is a schematic diagram illustrating phase signals controlling switches according to an embodiment.

Referring to FIG. 2 and FIG. 3 together, FIG. 3 is a schematic diagram illustrating phase signals controlling the switches according to an embodiment. The switches SW22 and SW31-SW3N are controlled by a phase signal $\phi_1$. The switch SW24 is controlled by a phase signal $\phi_{1h}$. The switches SW21 and SW51-SW5N are controlled by a phase signal $\phi_2$. The operation of the switched capacitor circuit 200 is divided into a first period 310 (also referred to a sampling phase) and a second period 320 (also referred to an amplifying phase), and the first period 310 further includes a sub period 311.

In the embodiment, the switch circuit is used to control an electrical connection between two units. That is, when "the switch circuit electrically connects a first unit to a second unit" is described hereinafter, it means the switch between the first unit and the second unit is closed. Note that the switch circuit includes the switches SW21, SW22, SW31-SW3N, SW24, and SW51-SW5N in the embodiment, but people in the art should be able to dispose more or less switches based on the disclosure. The number and the disposition location of the switches are not limited in the invention.

During the first period 310, the switches SW21 and SW51-SW5N are open, and the switches SW22 and SW31-SW3N are closed. In other words, the switch circuit electrically connects the second terminal of the feedback capacitor C21 to the input terminal 230, and electrically connects the second terminal of the capacitors $C_{S1}$-$C_{SN}$ to the input terminal 230. The input voltage $V_{in}$ charges the capacitors C21 and $C_{S1}$-$C_{SN}$ during the first period 310. During the sub period 311, the switch SW24 is closed, but during the rest part of the first period 310, the switch SW24 is open.

During the second period 320, the switches SW21 and SW51-SW5N are closed, and the switches SW22, SW31-SW3N and SW24 are open. In other words, the switch circuit electrically connects the second terminal of the feedback capacitor C21 to the output terminal of the differential amplifier 210. At this period, a voltage $V_x$ (also referred to a first voltage) is on the first input terminal of the differential amplifier 210, and herein the voltage $V_x$ denotes the difference voltage between the two output terminals of the differential amplifier 210. The amplifier 221 amplifies the voltage $V_x$ by a gain greater than 1, and the amplified voltage (also referred to a second voltage) is hold by the buffers $B_1$-$B_N$. Then, the feedback compensation circuit 220 applies the buffer output voltage (i.e. the second voltage) to the second terminals of the capacitors $C_{S1}$-$C_{SN}$.

In some embodiments, the gain of the amplifier 221 is equal to (N+1)/N and the second voltage is applied to the second terminals of all the capacitors $C_{S1}$-$C_{SN}$. Taking N=3 as an example, the gain is equal to 4/3. The capacitance of the capacitor C21 is denoted as C21, and the capacitances of the capacitor $C_{S1}$-$C_{SN}$ are the same and denoted as $C_S$ in following equations. If the capacitance C21 is equal to the capacitance $C_S$, then the law of charge conservation can be written as a following equation (6), and the output voltage $V_{OUT}$ is written in an equation (7).

$$V_{in}(C21 + C_S \times 3) = \left(\frac{4}{3}V_x - V_x\right) \times C_S \times 3 + (V_{OUT} - V_x) \times C21 \quad (6)$$
$$= V_{OUT} \times C21$$

$$V_{OUT} = \frac{C21 + C_S \times 3}{C21} V_{in} \quad (7)$$

The second voltage outputted by the feedback compensation circuit 220 cancels the voltage $V_x$ on the right-hand side of the equation (6). Therefore, the output voltage $V_{OUT}$ is irrelevant to the voltage $V_x$ in the equation (7), and is also irrelevant to the gain of the differential amplifier 210, thus the gain requirement of the differential amplifier 210 may be reduced.

Figure 4:
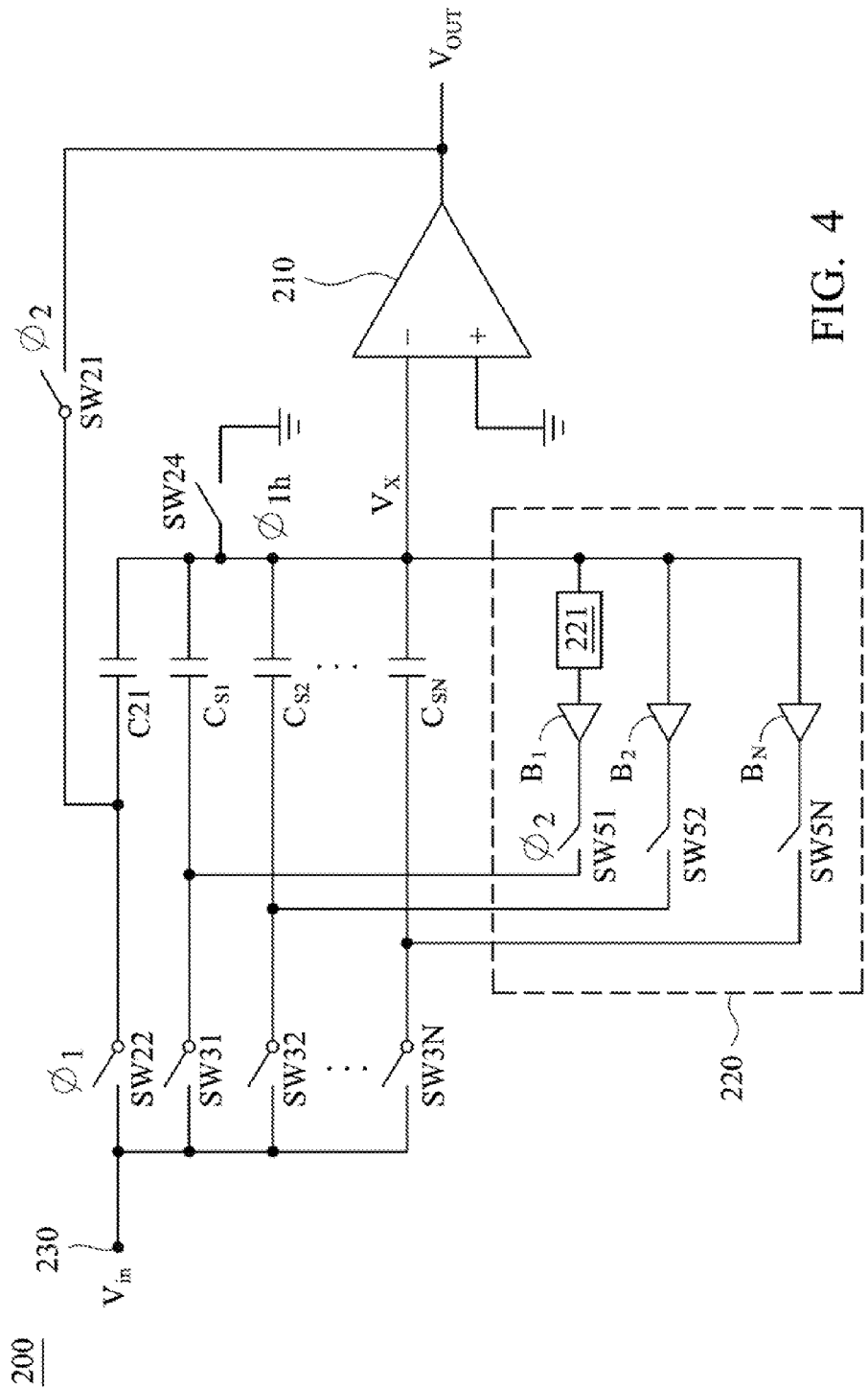
FIG. 4 is a diagram illustrating a switched capacitor circuit according to another embodiment.

FIG. 4 is a diagram illustrating a switched capacitor circuit according to another embodiment. In embodiment of FIG. 4, the second voltage outputted by the amplifier 221 is hold only in the buffer $B_1$, and the feedback compensation circuit 220 applies the second voltage only to the second terminal of the capacitor $C_{S1}$. In addition, the feedback compensation circuit 220 applies the voltage $V_x$ to the second terminals of other capacitors $C_{S2}$-$C_{SN}$. In the embodiment of FIG. 4, the gain of the amplifier 221 is 2. In this case, the law of charge conservation is written in a following equation (8), and the output voltage $V_{OUT}$ is written in an equation (9).

$$V_{in}(C21+C_S\times 3)$$
$$=(2V_x-V_x)\times C_S+(V_x-V_x)\times C_S\times 2+(V_{OUT}-V_x)\times C21$$
$$=V_{OUT}\times C21 \quad (8)$$

$$V_{OUT} = \frac{C21 + C_S \times 3}{C21} V_{in} \quad (9)$$

Note that the output voltage $V_{OUT}$ is irrelevant to the voltage $V_x$ and the gain of the differential amplifier 210 in the equation (9).

From another aspect of view, the sum of the voltage levels of the voltages applied to the capacitors $C_{S1}$-$C_{SN}$ during the second period is equal to $3*4/3V_x=4V_x$ in the embodiment of FIG. 2. Furthermore, the sum of the voltage levels of the voltages applied to the capacitors $C_{S1}$-$C_{SN}$ during the second period is equal to $2V_x+V_x+V_x=4V_x$ in the embodiment of FIG. 4. Therefore, if the sum of the voltage levels of voltages applied to the capacitors $C_{S1}$-$C_{SN}$ is equal to $(N+1)*V_x$, then it will have the same effect as described in the equations (6) and (8). People in the art should be able to implement another feedback compensation circuit 220 based of the disclosure of FIG. 2 and FIG. 4. The disposition location, the number and the gain of the amplifier 221 are not limited in the invention.

In the aforementioned embodiment, the feedback compensation circuit 220 amplifies the voltage $V_x$ during the first period, but the feedback compensation circuit 220 may amplify the voltage $V_x$ during the second period in other embodiments. For example, the switches SW51-SW5N may be disposed between the buffers $B_1$-$B_N$ and the amplifiers 221, and the buffers $B_1$-$B_N$ may be disposed between the SW51-SW5N and the first input terminal of the differential amplifier 210. The voltage $V_x$ is hold in the buffers $B_1$-$B_N$ during the first period, and the voltage $V_x$ is passed through the amplifiers $B_1$-$B_N$ and applied to the capacitors $C_{S1}$-$C_{SN}$ during the second period.

The switched capacitor circuit may have a wide range of applications, and people in the art should be able to modify the switched capacitor circuit 200 in FIG. 2 or FIG. 4 and apply it to other circuits. For example, the non-inverting terminal of the differential amplifier 210 may be coupled to a circuit instead of the virtual ground terminal in some embodiments. For another example, the feedback compensation circuit 220 may add a reference voltage to one or more second voltages, and applies the added second voltage to the second terminal of the corresponding capacitor $C_{S1}$-$C_{SN}$, and the effect thereof is equivalent to subtracting the reference voltage from the output voltage. An analogy-to-digital converter is taken as an example below.

Figure 5:
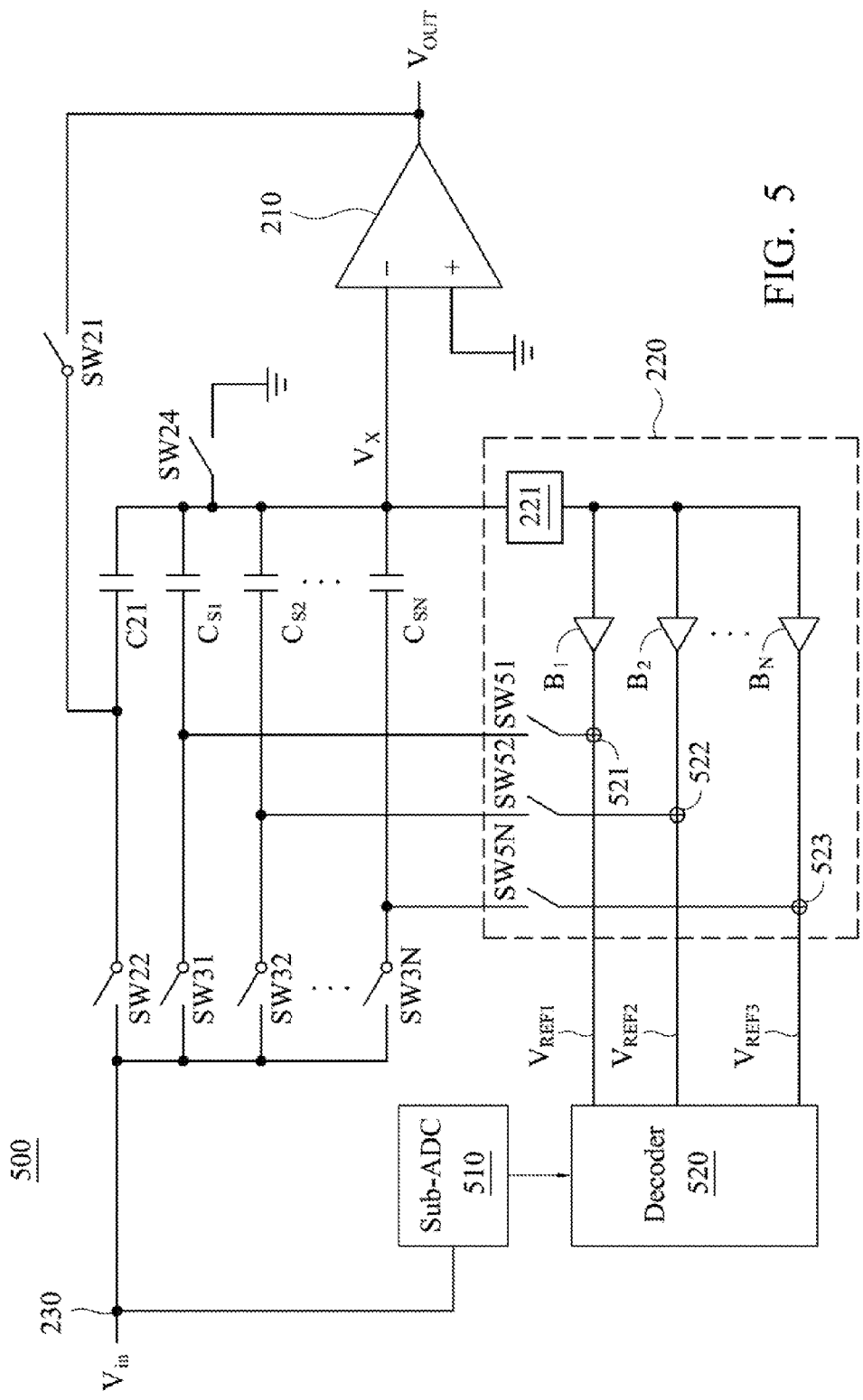
FIG. 5 is a diagram illustrating a switched capacitor circuit according to another embodiment.

Referring to FIG. 5, FIG. 5 is a diagram illustrating a switched capacitor circuit according to another embodiment. Generally speaking, a pipeline analog-to-digital (ADC) converter includes multiple stages. A switched capacitor circuit 500 is implemented as one of the stages in the embodiment of FIG. 5. The switched capacitor circuit 500 further includes, compared to FIG. 4, a sub-ADC 510 and a decoder 520. The input voltage $V_{in}$ is a voltage outputted from a previous stage. The sub-ADC 510 generates a digital code according to the input voltage $V_{in}$, and transmits the digital code to the decoder 520. The decoder 520 determines reference voltages $V_{REF1}$-$V_{REF3}$ according to the digital code. The reference voltages $V_{REF1}$-$V_{REF3}$ may have identical or different voltage levels, which is not limited in the invention. The reference voltage $V_{REF1}$-$V_{REF3}$ are added to the second voltage outputted by the amplifier 221, and the added voltages are applied to the capacitor $C_{S1}$-$C_{SN}$. The law of charge reservation is written in a following equation (10), and the output voltage is written in an equation (11).

$$V_{in}(C21 + C_S \times 3) = \left(V_{REF1} + \frac{4}{3}V_x - V_x\right) \times C_S + \left(V_{REF2} + \frac{4}{3}V_x - V_x\right) \times C_S + \left(V_{REF3} + \frac{4}{3}V_x - V_x\right) \times C_S + (V_{OUT} - V_x) \times C21 \quad (10)$$

$$V_{OUT} = 4V_{in} - V_{REF1} - V_{REF2} - V_{REF3} \quad (11)$$

Note that the output voltage $V_{OUT}$ is irrelevant to the voltage $V_x$ and the gain of the differential amplifier 210 in the equation (11).

Figure 6:
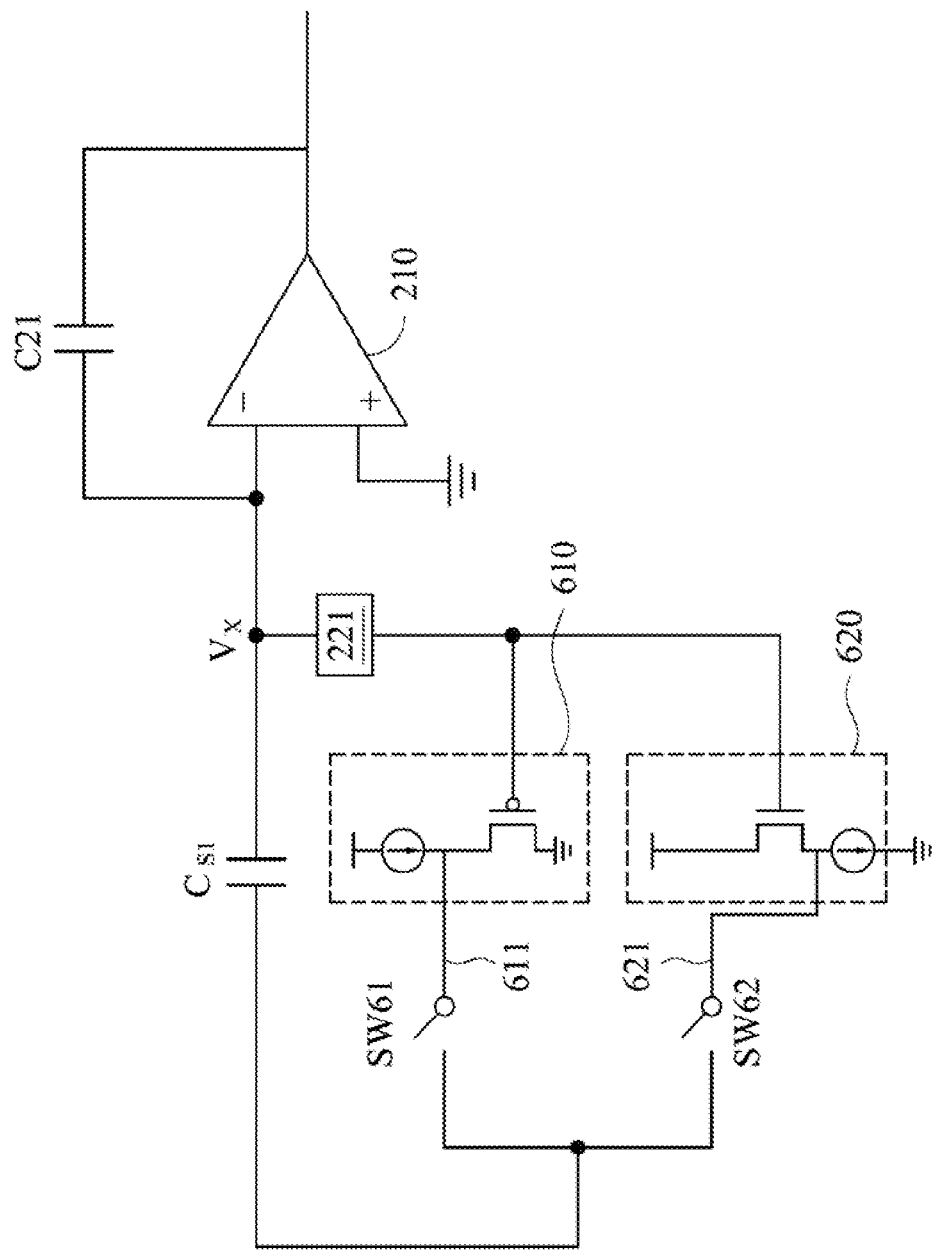
FIG. 6 is a diagram illustrating an implementation of adders, buffers, and a decoder according to an embodiment.

It is worth mentioning that the adders 521-523 and the buffers $B_1$-$B_N$ are schematic components which are used to add the reference voltages $V_{REF1}$-$V_{REF3}$ to the second voltages. However, the adders 521-523 and/or the buffer $B_1$-$B_N$ may be implemented as a variety of circuits. For example, the adders 521-523, the buffers $B_1$-$B_N$, and the decoder 520 may be implemented as source followers in some embodiments. To be specific, referring to FIG. 6, FIG. 6 is a diagram illustrating an implementation of the adder, the buffer, and the decoder according to an embodiment. Note that only one capacitor $C_{S1}$ is illustrated for clarity. The voltage $V_x$ is amplified by the amplifier 221, and the amplified voltage $V_x$ is added to a positive reference voltage $V_{REFP}$ and a negative reference voltage $V_{REFM}$ at the same time. A P-type metal oxide semiconductor (PMOS) source follower 610 generates a reference voltage 611 by level-shifting the amplified voltage $V_x$ up. The source follower 610 may be designed so that the reference voltage 611 is equal to the sum of the reference voltage $V_{REFP}$ and the amplified voltage $V_x$. A NMOS source follower 620 generates a reference voltage 621 by level-shifting the amplified voltage $V_x$ down, and the reference voltage 621 is equal to the sum of the reference voltage $V_{REFM}$ and the amplified voltage $V_x$. A switch SW61 and a switch SW62 operate depending on the digital code of the sub-ADC 510. If the switch SW61 is closed and the switch SW62 is open, then the reference voltage 611 is applied to the capacitor $C_{S1}$. If the switch SW61 is open and the switch SW62 is closed, then the reference voltage 621 is applied to the capacitor $C_{S1}$.

Figure 7:
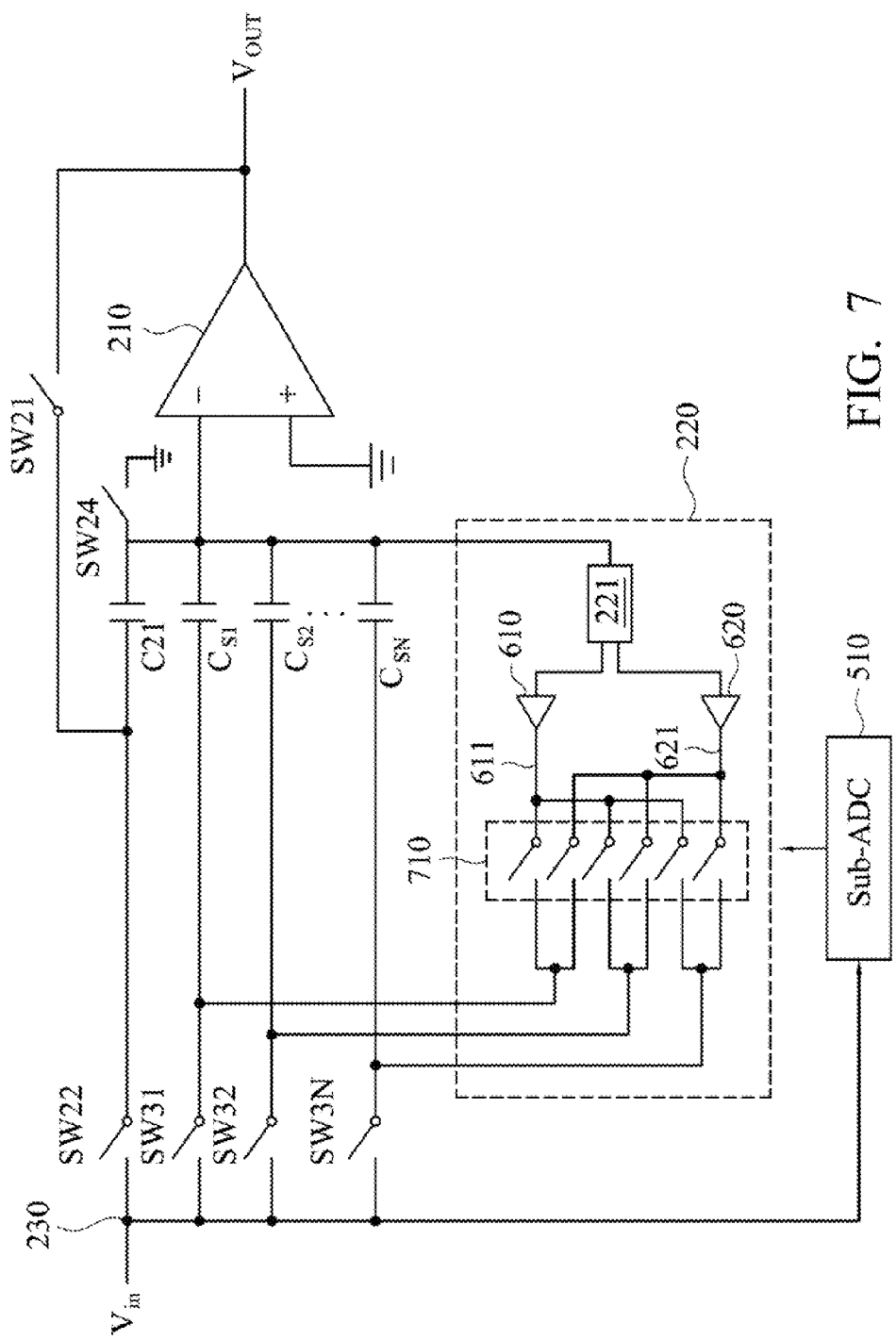
FIG. 7 is a diagram illustrating a switched capacitor according to another embodiment.

FIG. 7 is a diagram illustrating a switched capacitor circuit according to another embodiment. Referring to FIG. 6 and FIG. 7, a switch unit 710 operates according to the digital code outputted from the sub-ADC 510, and thus either the reference voltage 611 or the reference voltage 621 is applied to each of the capacitors $C_{S1}$-$C_{SN}$. Other operations in FIG. 7 are the same with that in FIG. 5, and therefore they will not be repeated.

Figure 8:
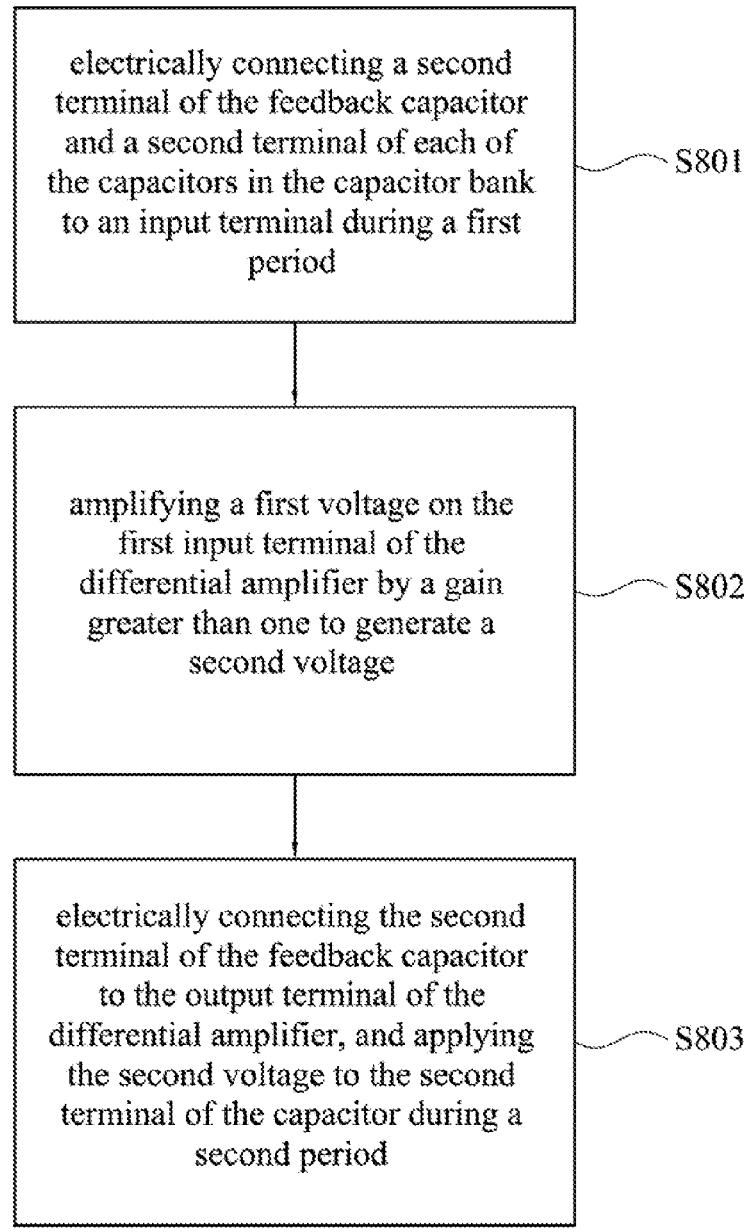
FIG. 8 is a diagram illustrating a flow chart of a compensation method for a switched capacitor circuit according to another embodiment.

FIG. 8 is a diagram illustrating a flow chart of a compensation method for the switched capacitor circuit according to another embodiment. In a step S801, a second terminal of the feedback capacitor and a second terminal of each of the capacitors in the capacitor bank are electrically connected to an input terminal during a first period. In a step S802, a first voltage on the first input terminal of the differential amplifier is amplified by a gain greater than one to generate a second voltage. In a step S803, the second terminal of the feedback capacitor is electrically connected to the output terminal of the differential amplifier, and the second voltage is applied to the second terminal of the capacitor during a second period. All steps in FIG. 8 have been described in detail above, and therefore they will not be repeated. Note that each step in FIG. 8 can be implemented as one or more circuits, and the specific structures of the circuits are not limited in the invention. In addition, the method of FIG. 8 may be performed with the aforementioned embodiments, or may be performed independently. In other words, another step may be added between the steps of FIG. 8.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A switched capacitor circuit, comprising:
a differential amplifier, having a first input terminal, a second input terminal and an output terminal;
a feedback capacitor, having a first terminal coupled to the first input terminal of the differential amplifier;
a capacitor bank, comprising at least one capacitor, wherein a first terminal of each of the at least one capacitor is coupled to the first input terminal of the differential amplifier;
a switch circuit; and
a feedback compensation circuit, coupled to the first input terminal of the differential amplifier and a second terminal of each of the at least one capacitor,
wherein during a first period, a second terminal of the feedback capacitor and the second terminal of each of the at least one capacitor are connected to an input terminal electrically through the switch circuit, wherein the feedback compensation circuit amplifies a first voltage on the first input terminal of the differential amplifier by a gain greater than one to generate a second voltage, wherein during a second period, the switch circuit electrically connects the second terminal of the feedback capacitor to the output terminal of the differential amplifier, and the feedback compensation circuit applies the second voltage to the second terminal of the at least one capacitor.

2. The switched capacitor circuit of claim 1, wherein the feedback compensation circuit comprises:
an amplifier, coupled to the first input terminal of the differential amplifier for amplifying the first voltage to generate the second voltage; and
a buffer, coupled between an output of the amplifier and the second terminal of the at least one capacitor.

3. The switched capacitor circuit of claim 2, wherein a number of the at least one capacitor is N, N is a positive integer, and the gain of the amplifier is (N+1)/N when the second voltage is applied to the second terminal of each of the at least one capacitor.

4. The switched capacitor circuit of claim 2, wherein a number of the at least one capacitor is greater than one, and the gain of the amplifier is 2 when the second voltage is applied to the second terminal of only one of the capacitors, wherein the feedback compensation circuit applies the first voltage to the second terminals of other ones of the capacitors.

5. The switched capacitor circuit of claim 2, wherein the switch circuit comprises:
a first switch, coupled between the second terminal of the feedback capacitor and the output terminal of the differential amplifier;
a second switch, coupled between the second terminal of the feedback capacitor and the input terminal;
at least one third switch, coupled between the input terminal and the second terminal of the at least one capacitor,
wherein during the first period, the first switch is open, and the second switch and the at least one third switch are dosed,
wherein during the second period, the first switch is closed, and the second switch and the at least one third switch are open.

6. The switched capacitor circuit of claim 5, wherein the switch circuit further comprises:
a fourth switch, coupled between the first terminal of the differential amplifier and a virtual ground terminal,
wherein the fourth switch is closed during a sub period of the first period, and is open during the second period.

7. The switched capacitor circuit of claim 6, wherein the switch circuit further comprises:
at least one fifth switch, coupled between the second terminal of the at least one capacitor and the buffer,
wherein the at least one fifth switch is open during the first period, and is closed during the second period.

8. The switched capacitor circuit of claim 1, further comprising:
a sub analogy-to-digital converter, coupled to the input terminal, and generating a digital code according to an input voltage on the input terminal; and
a decoder, coupled to the sub analogy-to-digital converter and the feedback compensation circuit, and determining a reference voltage according to the digital code.

9. A compensation method for a switched capacitor circuit, wherein the switched capacitor circuit comprises a differential amplifier, a feedback capacitor, and a capacitor bank comprising at least one capacitor, wherein a first terminal of the feedback capacitor is coupled to a first input terminal of the differential amplifier, a first terminal of each of the at least one capacitor is coupled to the first input terminal of the differential amplifier, and the compensation method comprises:
electrically connecting a second terminal of the feedback capacitor and a second terminal of each of the at least one capacitor to an input terminal during a first period;
electrically connecting the second terminal of the feedback capacitor to the output terminal of the differential amplifier;
amplifying a first voltage on the first input terminal of the differential amplifier by a gain greater than one to generate a second voltage; and
applying the second voltage to the second terminal of the at least one capacitor during a second period.

10. The compensation method of claim 9, wherein a number of the at least one capacitor is N, N is a positive integer, and the gain is (N+1)/N when the second voltage is applied to the second terminal of each of the at least one capacitor.

11. A pipeline analogy-to-digital converter, comprising:
a plurality of stages, wherein one of the stages comprises:
a differential amplifier, having a first input terminal, a second input terminal and an output terminal;
a feedback capacitor, having a first terminal coupled to the first input terminal of the differential amplifier;
a capacitor bank, comprising at least one capacitor, wherein a first terminal of each of the at least one capacitor is coupled to the first input terminal of the differential amplifier;
a switch circuit; and
a feedback compensation circuit, coupled to the first input terminal of the differential amplifier and a second terminal of each of the at least one capacitor,
wherein during a first period, a second terminal of the feedback capacitor and the second terminal of each of the at least one capacitor are connected to an input terminal electrically through the switch circuit,
wherein the feedback compensation circuit amplifies a first voltage on the first input terminal of the differential amplifier by a gain greater than one to generate a second voltage,
wherein during a second period, the switch circuit electrically connects the second terminal of the feedback capacitor to the output terminal of the differential amplifier, and the feedback compensation circuit applies the second voltage to the second terminal of the at least one capacitor.

* * * * *